(12) United States Patent
Nishijima

(10) Patent No.: US 8,624,239 B2
(45) Date of Patent: Jan. 7, 2014

(54) SEMICONDUCTOR DEVICE

(75) Inventor: Tatsuji Nishijima, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 131 days.

(21) Appl. No.: 13/105,384

(22) Filed: May 11, 2011

(65) Prior Publication Data

US 2011/0284837 A1 Nov. 24, 2011

(30) Foreign Application Priority Data

May 20, 2010 (JP) ................................. 2010-116568

(51) Int. Cl.
*H01L 29/10* (2006.01)
*H01L 29/12* (2006.01)

(52) U.S. Cl.
USPC ................ 257/43; 257/57; 257/E29.273

(58) Field of Classification Search
USPC ..................... 257/43, 57, E29.273
See application file for complete search history.

(56) References Cited

U.S. PATENT DOCUMENTS

| | | | |
|---|---|---|---|
| 5,731,613 A | 3/1998 | Yamazaki et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,038,239 B2 * | 5/2006 | Murakami et al. | ............. 257/59 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Jae Lee
*Assistant Examiner* — Grant Withers
(74) *Attorney, Agent, or Firm* — Eric J. Robinson; Robinson Intellectual Property Law Office, P.C.

(57) ABSTRACT

In a transistor, a drain electrode to which a high electric field is applied is formed over a flat surface, and an end portion of a gate electrode on the drain electrode side in a channel width direction and an end portion of the gate electrode in a channel length direction are covered with an oxide semiconductor with a gate insulating layer between the gate electrode and the oxide semiconductor layer, so that withstand voltage of the transistor is improved. Further, a semiconductor device for high power application, in which the transistor is used, can be provided.

17 Claims, 9 Drawing Sheets

(56) References Cited

U.S. PATENT DOCUMENTS

| | | | |
|---|---|---|---|
| 7,323,356 B2 | 1/2008 | Hosono et al. | |
| 7,385,224 B2 * | 6/2008 | Ishii et al. | 257/72 |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0167007 A1 * | 11/2002 | Yamazaki et al. | 257/57 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 * | 3/2006 | Hoffman et al. | 257/72 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 * | 3/2007 | Yabuta | 257/347 |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0277658 A1 * | 11/2008 | Lee et al. | 257/43 |
| 2008/0296565 A1 * | 12/2008 | Park et al. | 257/40 |
| 2008/0296568 A1 | 12/2008 | Ryu et al. | |
| 2008/0308796 A1 * | 12/2008 | Akimoto et al. | 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0121982 A1 * | 5/2009 | Choi et al. | 345/76 |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0206332 A1 * | 8/2009 | Son et al. | 257/43 |
| 2009/0212287 A1 * | 8/2009 | Nathan et al. | 257/57 |
| 2009/0212289 A1 * | 8/2009 | Gan et al. | 257/57 |
| 2009/0278122 A1 | 11/2009 | Hosono et al. | |
| 2009/0280600 A1 | 11/2009 | Hosono et al. | |
| 2010/0065839 A1 * | 3/2010 | Yamazaki et al. | 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0140610 A1 * | 6/2010 | Lee et al. | 257/43 |
| 2010/0181575 A1 * | 7/2010 | Makita et al. | 257/72 |
| 2010/0295041 A1 | 11/2010 | Kumomi et al. | |
| 2012/0223305 A1 * | 9/2012 | Sato et al. | 257/43 |
| 2012/0256184 A1 * | 10/2012 | Kaneko et al. | 257/59 |
| 2013/0001560 A1 * | 1/2013 | Maekawa et al. | 257/57 |
| 2013/0200370 A1 * | 8/2013 | Yamazaki et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and SN-Doped Zinc Indium Oxide Thin Film Transistors for AMOLED Backplane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15; No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

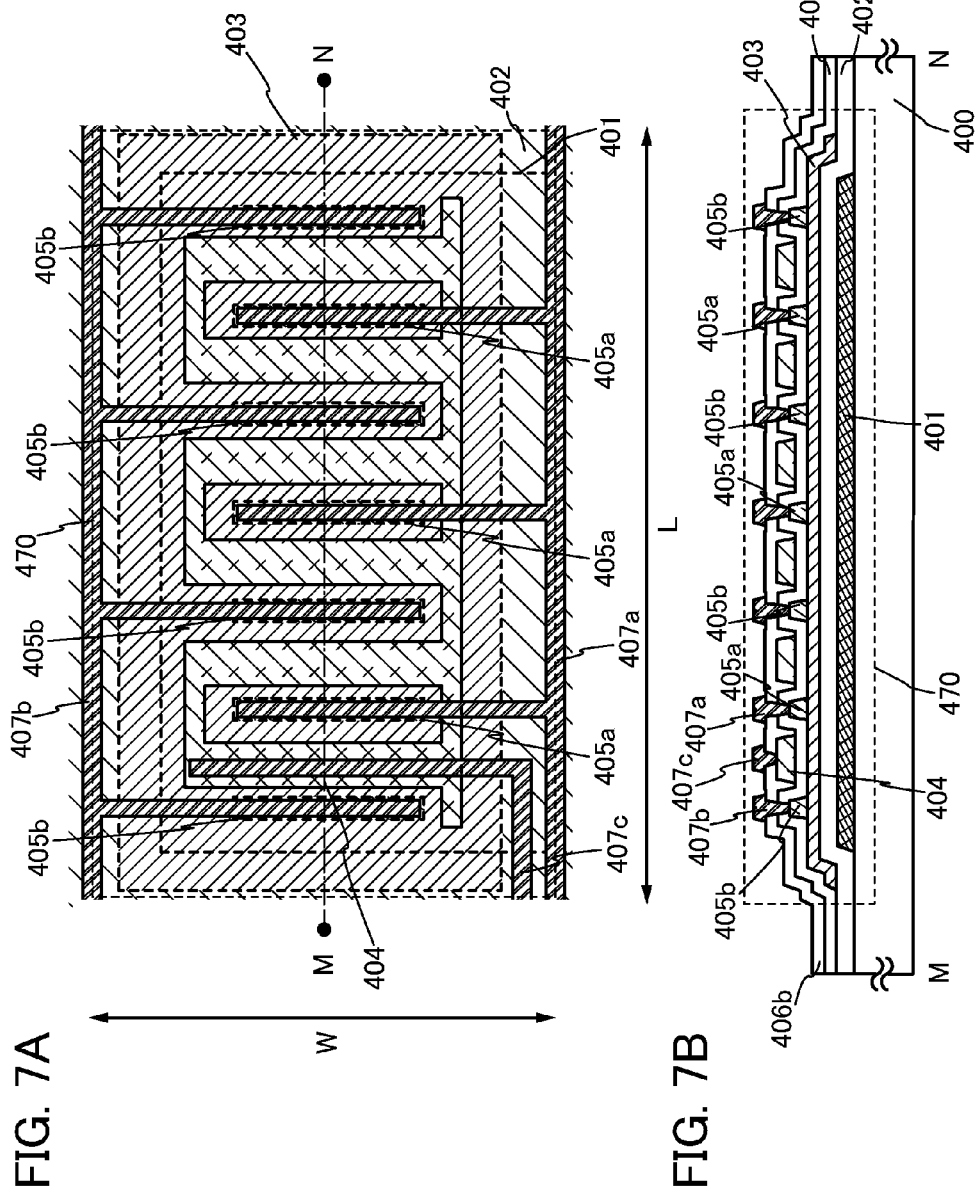

SEMICONDUCTOR DEVICE

BACKGROUND OF THE INVENTION

1. Field of the Invention

The present invention relates to a semiconductor device. Further, the present invention relates to an electronic appliance mounted with the semiconductor devices.

Note that the semiconductor device in this specification indicates all the devices that can operate by utilizing semiconductor characteristics. For example, a power device, a display device including the power device, an integrated circuit including the power device, and the like are included in the category of the semiconductor device.

2. Description of the Related Art

A technique by which transistors are formed using semiconductor thin films formed over a substrate having an insulating surface has been attracting attention. As a semiconductor thin film that can be applied to the transistors, a silicon-based semiconductor is known, and as another material, an oxide semiconductor has attracted attention.

For example, disclosed is a transistor whose active layer is formed using an amorphous oxide containing indium (In), gallium (Ga), and zinc (Zn) and having an electron carrier concentration of lower than $10^{18}/cm^3$ (see Patent Document 1).

[Reference]
[Patent Document]
[Patent Document 1] Japanese Published Patent Application No. 2006-165528

SUMMARY OF THE INVENTION

High voltage that is higher than or equal to 100 V is applied to a drain electrode of a transistor used for a semiconductor device for high power application; therefore, high withstand voltage is required.

Silicon carbide can be given as an example of a semiconductor material which has a possibility of increasing withstand voltage of a transistor. Since silicon carbide has a small interatomic distance of approximately 0.18 nm in a Si—C bond, a high bond energy, and a wide band gap which is approximately three times as wide as that of silicon, silicon carbide is known to be advantageous to increase in the withstand voltage of a semiconductor device, reduction in a loss of electric power, and the like.

However, silicon carbide is difficult to melt because of its characteristics and cannot be manufactured by a method having high productivity, such as a Czochralski (CZ) method or the like which is used for manufacturing a silicon wafer; therefore, commercialization of a semiconductor device using silicon carbide is delayed.

In view of the above problem, in one embodiment of the disclosed invention, one object is to provide a transistor with improved withstand voltage, which is manufactured using a semiconductor material having high productivity. Further, another object is to provide a semiconductor device for high power application, in which a transistor having high withstand voltage is used.

In one embodiment of the disclosed invention, in a transistor, a drain electrode to which a high electric field is applied is formed over a flat surface of a semiconductor layer, and an end portion of a gate electrode on the drain electrode side in a channel width direction and an end portion of the gate electrode in a channel length direction are covered with an oxide semiconductor layer with a gate insulating layer therebetween, so that withstand voltage of the semiconductor device is improved. Further, for the semiconductor layer of the transistor, an oxide semiconductor having high productivity, in which a breakdown does not easily occur, is used.

Specifically, one embodiment of the present invention is a semiconductor device including a gate electrode; a gate insulating layer covering the gate electrode; an oxide semiconductor layer provided over the gate insulating layer; a first source electrode and a first drain electrode provided in contact with the oxide semiconductor layer; an insulating layer covering the oxide semiconductor layer, the first source electrode, and the first drain electrode; and a second source electrode and a second drain electrode provided over the insulating layer, which are electrically connected to the first source electrode and the first drain electrode, respectively. A region where the first source electrode and the first drain electrode are in contact with the oxide semiconductor layer is in a region where the oxide semiconductor layer and the gate electrode overlap with each other. A length of the oxide semiconductor layer in a channel length direction is longer than a length of the gate electrode in a channel length direction. The second drain electrode includes a region overlapping with the gate electrode. In the region, at least the oxide semiconductor layer is provided between the second drain electrode and the gate electrode.

Another embodiment of the present invention is a semiconductor device including a gate electrode; a gate insulating layer covering the gate electrode; an oxide semiconductor layer provided over the gate insulating layer; a first source electrode and a first drain electrode provided in contact with the oxide semiconductor layer; a first insulating layer covering the oxide semiconductor layer, the first source electrode, and the first drain electrode; a first conductive layer provided over the first insulating layer; a second insulating layer covering the first conductive layer; and a second source electrode electrically connected to the first source electrode, a second drain electrode electrically connected to the first drain electrode, and a second conductive layer electrically connected to the first conductive layer, which are provided over the second insulating layer. A region where the first source electrode and the first drain electrode are in contact with the oxide semiconductor layer is in a region where the oxide semiconductor layer and the gate electrode overlap with each other. A length of the oxide semiconductor layer in a channel length direction is longer than a length of the gate electrode in a channel length direction. The second drain electrode includes a region overlapping with the gate electrode. In the region, at least the oxide semiconductor layer is provided between the second drain electrode and the gate electrode.

Another embodiment of the present invention is a semiconductor device including a gate electrode; a gate insulating layer covering the gate electrode; an oxide semiconductor layer provided over the gate insulating layer; a plurality of first source electrodes and a plurality of first drain electrodes which are provided in contact with the oxide semiconductor layer; an insulating layer covering the oxide semiconductor layer, the plurality of first source electrodes and the plurality of first drain electrodes; and a second source electrode electrically connected to each of the first source electrodes and a second drain electrode electrically connected to each of the first drain electrodes, which are provided over the insulating layer. A region where each of the first source electrodes and the first drain electrodes is in contact with the oxide semiconductor layer is in a region where the oxide semiconductor layer and the gate electrode overlap with each other. A length of the oxide semiconductor layer in a channel length direction is longer than a length of the gate electrode in a channel length direction. The second drain electrode includes a region overlapping with the gate electrode. In the region, at least the oxide semiconductor layer is provided between the second drain electrode and the gate electrode.

Another embodiment of the present invention is a semiconductor device including a gate electrode; a gate insulating layer covering the gate electrode; an oxide semiconductor layer provided over the gate insulating layer; a plurality of first source electrodes and a plurality of first drain electrodes which are provided in contact with the oxide semiconductor layer; a first insulating layer covering the oxide semiconductor layer, the plurality of first source electrodes, and the plurality of first drain electrodes; a first conductive layer provided over the first insulating layer; a second insulating layer covering the first conductive layer; and a second source electrode electrically connected to each of the first source electrodes, a second drain electrode electrically connected to each of the first drain electrodes, and a second conductive layer electrically connected to the first conductive layer, which are provided over the second insulating layer. A region where each of the first source electrodes and the first drain electrodes is in contact with the oxide semiconductor layer is in a region where the oxide semiconductor layer and the gate electrode overlap with each other. A length of the oxide semiconductor layer in a channel length direction is longer than a length of the gate electrode in a channel length direction. The second drain electrode includes a region overlapping with the gate electrode. In the region, at least the oxide semiconductor layer is provided between the second drain electrode and the gate electrode.

In the above semiconductor device, it is preferable that the first conductive layer do not overlap with the second drain electrode.

As a semiconductor device for high power application, a power device can be given as an example. Here, a power device refers to a semiconductor device used for power conversion or the like, which has high withstand voltage, large current, and a high speed in power conversion. As a power device, a power MOSFET can be given, for example. A power MOSFET is characterized by a high switching speed, a high conversion efficiency with a comparatively low voltage, as compared to other power devices.

According to one embodiment of the disclosed invention, a transistor having improved withstand voltage can be provided. Further, a semiconductor device for high power application, which includes the transistor, can be provided.

BRIEF DESCRIPTION OF THE DRAWINGS

In the accompanying drawings:

FIGS. 7A and 7B are a plan view and a cross-sectional view of a semiconductor device;

DETAILED DESCRIPTION OF THE INVENTION

Figure 1A:
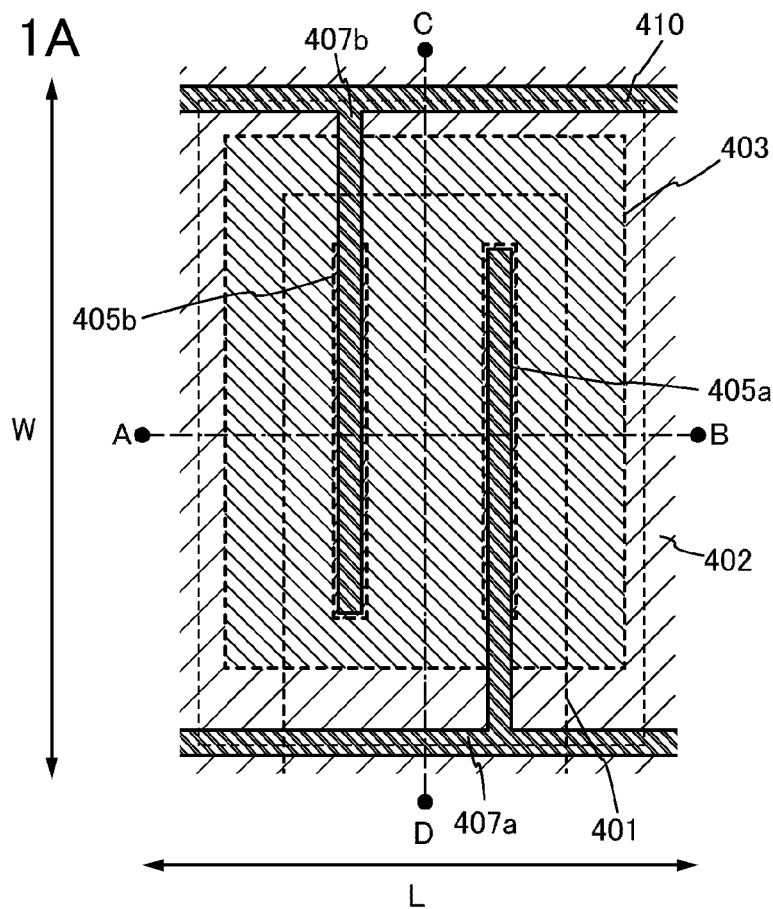
FIG. 1A is a plan view and FIGS. 1B and 1C are cross-sectional views of a semiconductor device.

Embodiments of the present invention will be described with reference to the accompanying drawings. Note that the present invention is not limited to the following description and it will be readily appreciated by those skilled in the art that modes and details can be modified in various ways without departing from the spirit and the scope of the present invention. Therefore, the present invention should not be limited to the descriptions of the embodiments below. Note that in structures of the present invention described below, the same reference numerals are used for the same portions and portions having similar functions in different drawings, and the description thereof is not repeated.

Note that in each drawing described in this specification, the size, the layer thickness, or the region of each component is exaggerated for clarity in some cases. Therefore, embodiments of the present invention are not limited to such scales.

In this specification, ordinal numbers such as "first", "second", and "third" are used in order to avoid confusion among components, and the terms do not limit the components numerically.

Note that in this specification, voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or a voltage, and a potential and a voltage are used as synonymous words in many cases. Thus, in this specification, a potential may be rephrased as voltage and voltage may be rephrased as a potential unless otherwise specified.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

(Embodiment 1)

In this embodiment, one embodiment of a semiconductor device and a method for manufacturing the semiconductor device will be described with reference to FIGS. 1A to 1C, FIGS. 2A to 2D, FIGS. 3A to 3C, and FIGS. 4A and 4B.

Figure 1B:
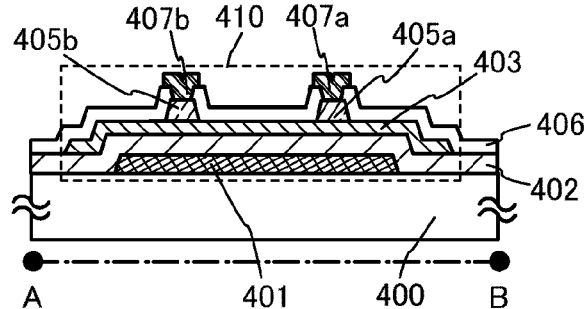
Figure 1C:
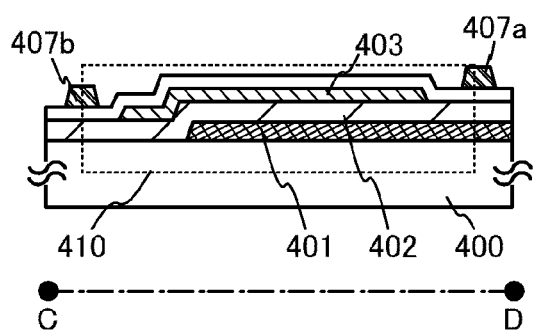

FIG. 1A is a plan view of a transistor 410. FIG. 1B is a cross-sectional view taken along line A-B in FIG. 1A. FIG. 1C is a cross-sectional view taken along line C-D in FIG. 1A.

The transistor 410 illustrated in FIGS. 1A to 1C includes, over a substrate 400, a gate electrode 401, a gate insulating layer 402 covering the gate electrode 401, an oxide semiconductor layer 403 provided over the gate insulating layer 402, a first source electrode 405a and a first drain electrode 405b provided in contact with the oxide semiconductor layer 403, an insulating layer 406 covering the oxide semiconductor layer 403, the first source electrode 405a, and the first drain electrode 405b, and a second source electrode 407a and a second drain electrode 407b provided over the insulating layer 406. The insulating layer 406 has an opening portion (contact hole) in a region overlapping with the first source electrode 405a and an opening portion in a region overlapping with the first drain electrode 405b. In the opening portions, the first source electrode 405a and the second source electrode 407a are electrically connected to each other, and the first drain electrode 405b and the second drain electrode 407b are electrically connected to each other.

In the transistor 410 illustrated in FIGS. 1A to 1C, the oxide semiconductor layer 403 has a step in a region where an end portion of the gate electrode 401 is covered with the oxide semiconductor layer 403, and the step portion is locally thinner than the other region. A region where the first source electrode 405a and the first drain electrode 405b are in contact with the oxide semiconductor layer 403 is in a region where the oxide semiconductor layer 403 and the gate electrode 401 overlap with each other. That is, the first source electrode 405a and the first drain electrode 405b are formed over a flat surface of the oxide semiconductor layer 403 (a surface which is substantially parallel to an upper surface of the gate electrode 401). Accordingly, the first source electrode 405a and the first drain electrode 405b do not cover the step of the oxide semiconductor layer 403 and defective coverage with the first source electrode 405a and the first drain electrode 405b can be prevented.

In the case where the first source electrode 405a and the first drain electrode 405b are formed so as to overlap with the steps of the oxide semiconductor layer 403, the first source electrode 405a and the first drain electrode 405b are in contact with locally thin regions in the oxide semiconductor layer 403. In that case, since withstand voltage is low in a thin region, an electric field might concentrate in the region, causing breakdown of a transistor. In particular, in the case where a transistor is used for a power device, voltage higher than or equal to 100 V is applied to a drain electrode in some cases and destruction due to the high electric field is more likely to be caused. However, since the first source electrode 405a and the first drain electrode 405b are formed over the flat surface of the oxide semiconductor layer 403 in the transistor 410 described in this embodiment, withstand voltage of the transistor 410 can be improved.

Further, in the transistor 410, the length of the oxide semiconductor layer 403 in a channel length (L) direction (a direction in which carriers flow) is longer than the length of the gate electrode 401 in a channel length direction. The oxide semiconductor layer 403 covers the gate electrode 401 with the gate insulating layer 402 interposed therebetween in a channel length direction. Further, the second drain electrode 407b has a region overlapping with the gate electrode 401. In the region, the oxide semiconductor layer 403 is provided between the second drain electrode 407b and the gate electrode 401. That is, an end portion of the gate electrode 401 on the second drain electrode 407b side in a channel width (W) direction is covered with the oxide semiconductor layer 403 with the gate insulating layer 402 interposed therebetween.

Accordingly, in the transistor 410, the oxide semiconductor layer 403 is provided between the first drain electrode 405b and the gate electrode 401 and between the second drain electrode 407b and the gate electrode 401. An oxide semiconductor has an energy gap as wide as 3.0 eV to 3.5 eV and thus, withstand voltage is high. When the oxide semiconductor layer 403 having high withstand voltage is provided between the gate electrode, and the first drain electrode and the second drain electrode both to which a high electric field is applied, generation of current between the gate electrode, and the first drain electrode or the second drain electrode can be prevented; accordingly, degradation or destruction of the transistor 410 can be suppressed.

An example of a method for manufacturing the semiconductor device will be described below with reference to FIGS. 2A to 2D.

First, a conductive layer is formed over the substrate 400 having an insulating surface and the conductive layer is selectively etched to form the gate electrode 401.

There is no particular limitation on a substrate that can be used as the substrate 400 having an insulating surface as long as it has at least heat resistance to withstand heat treatment to be performed later. For example, a glass substrate such as a barium borosilicate glass substrate or an aluminoborosilicate glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 400. Still alternatively, any of these substrates further provided with a semiconductor element may be used as the substrate 400.

Further, a flexible substrate may be used as the substrate 400. In the case where a flexible substrate is used, a transistor including an oxide semiconductor film may be directly formed over the flexible substrate.

An insulating film serving as a base film may be provided between the substrate 400 and the gate electrode 401. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film.

The gate electrode 401 may be formed to have a single-layer structure or a stacked-layer structure using any of metal materials such as molybdenum, titanium, tantalum, tungsten, aluminum, copper, neodymium, and scandium, and an alloy material containing any of these materials as its main component by a plasma CVD method, a sputtering method, or the like.

Figure 2A:
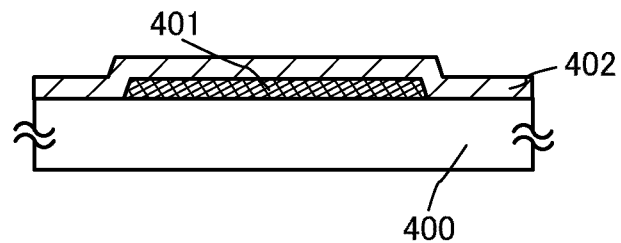
FIGS. 2A to 2D are cross-sectional views illustrating manufacturing steps of a semiconductor device.

Next, the gate insulating layer 402 is formed over the gate electrode 401 (see FIG. 2A). The gate insulating layer 402 can be formed by a CVD method, a sputtering method, or the like. The gate insulating layer 402 preferably contains silicon oxide, silicon nitride, silicon oxynitride, aluminum oxide, tantalum oxide, gallium oxide, or the like. Alternatively, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like may be used. The gate insulating layer 402 may have a single-layer structure or a stacked-layer structure. There is no particular limitation on the thickness of the gate insulating layer 402.

Figure 2B:
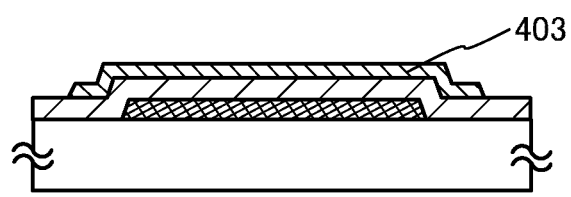

Next, after an oxide semiconductor layer is formed over the gate insulating layer 402, the oxide semiconductor layer is selectively etched to form the oxide semiconductor layer 403 (see FIG. 2B).

The oxide semiconductor layer can be formed using a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, an In—Ga—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor; a single-component metal oxide such as an In—O-based oxide semiconductor, a Sn—O-based oxide semiconductor, or a Zn—O-based oxide semiconductor; or the like.

In particular, an In—Ga—Zn—O-based oxide semiconductor material has sufficiently high resistance when there is no electric field and thus off-state current can be sufficiently reduced. In addition, with high field-effect mobility, the In—Ga—Zn—O-based oxide semiconductor material is suitable for a semiconductor device.

As a typical example of the In—Ga—Zn—O-based oxide semiconductor material, one represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), and the like. For example, M can be Ga, Ga and Al, Ga and Fe, Ga and Ni, Ga and Mn, Ga and Co, or the like. Note that the above-described compositions are derived from the crystal structures that the oxide semiconductor material can have and are mere examples.

As a target used for forming the oxide semiconductor layer by a sputtering method, a target having a composition ratio of In:Ga:Zn=1:x:y (x is greater than or equal to 0 and y is greater than or equal to 0.5 and less than or equal to 5) is preferably used. For example, a target for oxide semiconductor deposition which has a composition ratio of $In_2O_3:Ga_2O_3:ZnO=1:1:2$ [molar ratio] (x=1, y=1) or the like can be used. Alternatively, a target for oxide semiconductor deposition which has a composition ratio of $In_2O_3:Ga_2O_3:ZnO=1:1:1$ [molar ratio] (x=1, y=0.5), a composition ratio of $In_2O_3:Ga_2O_3:ZnO=1:1:4$ [molar ratio] (x=1, y=2), or a composition ratio of $In_2O_3:Ga_2O_3:ZnO=1:0:2$ [molar ratio] (x=0, y=1) can be used.

In the case where an In—Zn—O-based material is used as the oxide semiconductor, the composition ratio of a target used is In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), more preferably In:Zn=15:1 to 1.5:1 in an atomic ratio ($In_2O_3:ZnO=15:2$ to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

In this embodiment, an oxide semiconductor layer with an amorphous structure is formed by a sputtering method with the use of a target for forming an In—Ga—Zn—O-based oxide semiconductor.

It is preferable that a metal oxide contained in the target for forming an oxide semiconductor have a relative density of 80% or more, preferably 95% or more, more preferably 99.9% or more. With the use of a target for forming an oxide semiconductor with high relative density, an oxide semiconductor layer with a dense structure can be formed.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas atmosphere, for example, from which an impurity such as hydrogen, water, a hydroxyl group, or hydride is removed to a concentration of 1 ppm or less (preferably, 10 ppb or less).

In forming the oxide semiconductor layer, the object is held in a treatment chamber that is maintained under reduced pressure, and is heated so that the temperature of the object is higher than or equal to 100° C. and lower than 550° C., preferably higher than or equal to 200° C. and lower than or equal to 400° C. Alternatively, the temperature of the object in forming the oxide semiconductor layer may be room temperature (25° C.±10° C.). Then, a sputtering gas from which hydrogen, water, and the like are removed is introduced into the treatment chamber while moisture in the treatment chamber is removed, whereby the oxide semiconductor layer is formed using the above target. By forming the oxide semiconductor layer while the object is heated, impurities in the oxide semiconductor layer can be reduced. In addition, damage of the oxide semiconductor layer due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By evacuation with the use of a cryopump or the like, hydrogen, water, and the like can be removed from the treatment chamber; thus, the impurity concentration in the oxide semiconductor layer can be reduced.

The oxide semiconductor layer can be formed under the following conditions, for example: the distance between the object and the target is 170 mm, the pressure is 0.4 Pa, the direct current (DC) power is 0.5 kW, and the atmosphere is an oxygen (oxygen: 100%) atmosphere, an argon (argon: 100%) atmosphere, or a mixed atmosphere including oxygen and argon. Note that a pulsed direct current (DC) power source is preferably used because powder substances (also referred to as particles or dust) generated in film formation can be reduced and unevenness in film thickness can be reduced. Note that the appropriate thickness of the oxide semiconductor layer differs depending on the oxide semiconductor material to be used, the intended use of the semiconductor device, or the like; therefore, the thickness can be determined in accordance with the material, the intended use, or the like.

Note that before the oxide semiconductor layer is formed by a sputtering method, reverse sputtering in which an argon gas is introduced and plasma is generated is preferably performed to remove a material attached to the surface where the oxide semiconductor layer is to be formed (e.g., a surface of the gate insulating layer 402). Here, the reverse sputtering refers to a method in which ions collide with a surface of the substrate to be processed in order to modify the surface, in contrast to normal sputtering which refers to a method in which ions collide with a sputtering target. An example of a method for making ions collide with a surface to be processed is a method in which high-frequency voltage is applied to the surface to be processed in an argon atmosphere so that plasma is generated in the vicinity of the object. Note that an atmosphere of nitrogen, helium, oxygen, or the like may be used instead of an argon atmosphere.

After that, heat treatment (first heat treatment) is preferably performed on the oxide semiconductor layer. Excessive hydrogen (including water and a hydroxyl group) in the oxide semiconductor layer is removed by the first heat treatment and a structure of the oxide semiconductor layer is improved, so that defect levels in the energy gap of the oxide semiconductor layer can be reduced. The temperature of the first heat treatment is, for example, higher than or equal to 300° C. and lower than 550° C., preferably higher than or equal to 400° C. and lower than or equal to 500° C.

The heat treatment can be performed in such a way that, for example, an object to be heated is introduced into an electric furnace in which a resistance heating element or the like is used and heated under a nitrogen atmosphere at 450° C. for 1 hour. During the heat treatment, the oxide semiconductor layer is not exposed to the atmosphere to prevent entry of water and hydrogen.

The heat treatment apparatus is not limited to the electric furnace and may be an apparatus for heating an object by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, such as nitrogen or a rare gas such as argon is used.

For example, as the first heat treatment, GRTA treatment may be performed as follows. The object is put in an inert gas atmosphere that has been heated, heated for several minutes, and taken out from the inert gas atmosphere. The GRTA treatment enables high-temperature heat treatment in a short time. Moreover, the GRTA treatment can be employed even when the temperature exceeds the upper temperature limit of the object. Note that the inert gas may be switched to a gas including oxygen during the treatment. This is because defect levels in the energy gap due to oxygen deficiency can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is 1 ppm or less, preferably 0.1 ppm or less).

In any case, a transistor with extremely excellent characteristics can be obtained with the use of the oxide semiconductor layer which is an i-type (intrinsic) or substantially i-type oxide semiconductor layer obtained by reducing an impurity through the first heat treatment.

The above heat treatment (first heat treatment) can be referred to as dehydration treatment, dehydrogenation treatment, or the like because of its effect of removing hydrogen, water, and the like. The dehydration treatment or the dehydrogenation treatment can be performed after formation of the first source electrode or the like. Such dehydration treatment or dehydrogenation treatment may be conducted once or plural times.

The oxide semiconductor layer may be etched either before or after the heat treatment. In view of miniaturization of elements, dry etching is preferably used; however, wet etching may be used. An etching gas and an etchant can be selected as appropriate depending on a material of layers to be etched. Note that in the case where leakage in an element does not cause a problem, the oxide semiconductor layer may be used without being processed to have an island shape.

Figure 2C:
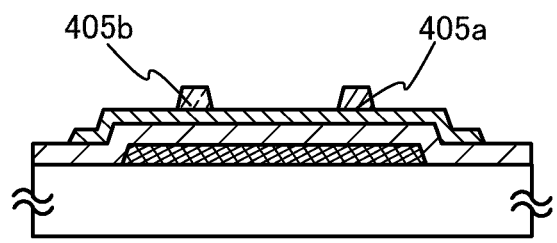
Figure 2D:
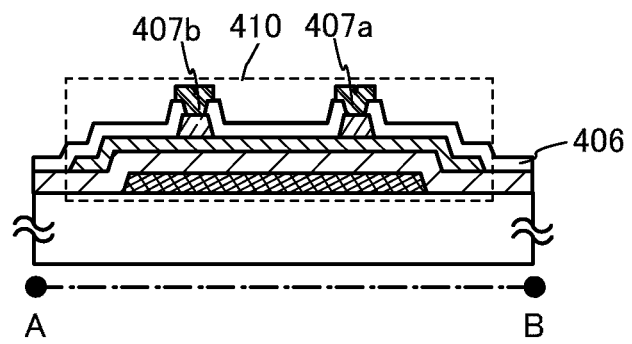

Next, a conductive layer is formed over the oxide semiconductor layer 403 and the conductive layer is selectively etched to form the first source electrode 405a and the first drain electrode 405b in a region where the oxide semiconductor layer 403 and the gate electrode 401 overlap with each other (see FIG. 2C).

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer can have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the first source electrode 405a and the first drain electrode 405b having tapered shapes.

Alternatively, the conductive layer may be formed using a conductive metal oxide. As a conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO in some cases), indium oxide-zinc oxide alloy ($In_2O_3$—ZnO), or any of these metal oxide materials in which silicon or silicon oxide is contained can be used.

The conductive layer is preferably etched such that the first source electrode 405a and the first drain electrode 405b are formed to have tapered end portions. Here, a taper angle is, for example, preferably greater than or equal to 30° and less than or equal to 60°. When the first source electrode 405a and the first drain electrode 405b are formed by etching so as to have tapered end portions, coverage with the insulating layer 406 which is formed later can be improved and disconnection of the insulating layer 406 can be prevented.

Next, the insulating layer 406 covering the oxide semiconductor layer 403, the first source electrode 405a, the first drain electrode 405b, and the like is formed, and opening portions are formed in the insulating layer 406 in a region overlapping with the first source electrode 405a and in a region overlapping with the first drain electrode 405b. After that, a conductive layer is formed over the insulating layer 406, and the conductive layer is selectively etched to form the second source electrode 407a in contact with the first electrode 405a and the second drain electrode 407b in contact with the first drain electrode 405b each in the opening portion provided in the insulating layer 406 (see FIG. 2D).

The insulating layer 406 can be formed using a material including an inorganic insulating material such as silicon oxide, silicon oxynitride, silicon nitride, hafnium oxide, aluminum oxide, or gallium oxide by a PVD method, a CVD method, or the like. Note that the opening portions in the insulating layer 406 are formed by selective etching with the use of a mask or the like.

For the insulating layer 406, a material with a low dielectric constant may be preferably used or a structure with a low dielectric constant (e.g., a porous structure) may be preferably employed. This is because when the dielectric constant of the insulating layer 406 is reduced, the capacitance generated between wirings or electrodes can be reduced, which results in high speed operation. Note that the insulating layer 406 may have a single-layer structure or a stacked-layer structure of two or more layers.

After formation of the insulating layer 406, second heat treatment is preferably performed in an inert gas atmosphere or an oxygen atmosphere. The temperature of the heat treatment is set in the range of higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. In the case where the insulating layer 406 contains oxygen, oxygen is supplied to the oxide semiconductor layer 403 to compensate oxygen deficiency of the oxide semiconductor layer 403, so that the oxide semiconductor layer can be an i-type (intrinsic) or substantially i-type oxide semiconductor layer. Oxygen may be supplied by plasma treatment in addition to the second heat treatment or instead of the second heat treatment. As the plasma treatment, an inductively coupled plasma (ICP) method, a method using high-density plasma of microwaves (e.g., a frequency of 2.45 GHz), or the like can be used as appropriate.

Note that although the second heat treatment is performed in this embodiment after the insulating layer 406 is formed, there is no particular limitation on the timing of the second heat treatment. For example, the second heat treatment may be performed after the second source electrode 407a and the second drain electrode 407b are formed. Alternatively, the second heat treatment may be performed following the first heat treatment, the first heat treatment may also serve as the second heat treatment, or the second heat treatment may also serve as the first heat treatment.

As described above, at least one of the first heat treatment and the second heat treatment is applied, whereby the oxide semiconductor layer 403 can be highly purified so as to contain impurities other than main components as little as possible. By highly purifying the oxide semiconductor layer 403, the concentration of hydrogen contained in the oxide semiconductor layer 403 can be less than or equal to $5 \times 10^{19}$ atoms/cm$^3$, preferably less than or equal to $5 \times 10^{18}$ atoms/cm$^3$, more preferably less than or equal to $5 \times 10^{17}$ atoms/cm$^3$. The oxide semiconductor layer 403 has a sufficiently low carrier density (e.g., less than $1 \times 10^{12}$/cm$^3$, more preferably less than $1.45 \times 10^{10}$/cm$^3$) as compared to a general silicon wafer having a carrier density of approximately $1 \times 10^{14}$/cm$^3$.

With the use of the highly purified and intrinsic oxide semiconductor layer 403, off-state current of a transistor can be sufficiently reduced. Further, because an oxide semiconductor has an energy gap as wide as 3.0 eV to 3.5 eV and includes extremely few thermally excited carriers, characteristics of the transistor including an oxide semiconductor do not deteriorate even in a high temperature environment and high withstand voltage can be obtained.

The second source electrode 407a and the second drain electrode 407b can be formed in such a manner that a conductive layer is formed over the insulating layer 406 and the conductive layer is selectively etched. The conductive layer to be the second source electrode 407a and the second drain electrode 407b can be formed by a PVD method such as a sputtering method or a CVD method such as a plasma CVD method. The details are similar to those of the first source electrode 405a and the first drain electrode 405b; thus, the description thereof can be referred to.

Thus, the transistor 410 is completed.

MODIFICATION EXAMPLE

Next, another structure of the semiconductor device illustrated in FIGS. 1A to 1C will be described with reference to FIGS. 3A to 3C.

Figure 3A:
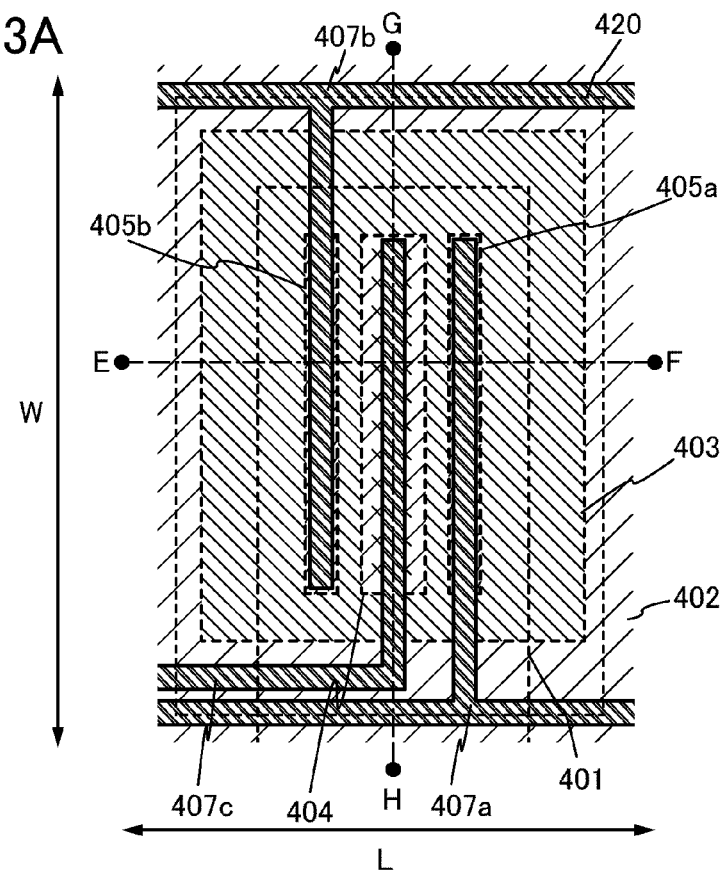
FIG. 3A is a plan view and FIGS. 3B and 3C are cross-sectional views of a semiconductor device.

FIG. 3A is a plan view of a transistor 420. FIG. 3B is a cross-sectional view taken along line E-F in FIG. 3A. FIG. 3C is a cross-sectional view taken along line G-H in FIG. 3A.

Figure 3B:
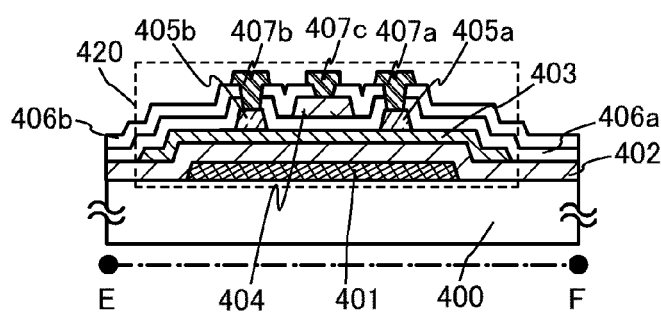
Figure 3C:
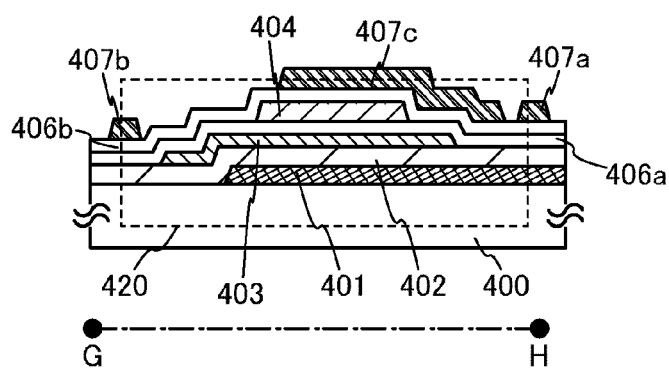

The transistor 420 illustrated in FIGS. 3A to 3C includes, over the substrate 400, the gate electrode 401, the gate insulating layer 402 covering the gate electrode 401, the oxide semiconductor layer 403 provided over the gate insulating layer 402, the first source electrode 405a and the first drain electrode 405b provided in contact with the oxide semiconductor layer 403, a first insulating layer 406a covering the oxide semiconductor layer 403, the first source electrode 405a, and the first drain electrode 405b, a first conductive layer 404 provided over the first insulating layer 406a, a second insulating layer 406b covering the first conductive layer 404, and the second source electrode 407a, the second drain electrode 407b, and a second conductive layer 407c provided over the second insulating layer 406b. The first insulating layer 406a has an opening portion (a contact hole) in a region overlapping with the first source electrode 405a and an opening portion in a region overlapping with the first drain electrode 405b. The second insulating layer 406b has an opening portion in a region overlapping with the first source electrode 405a, an opening portion in a region overlapping with the first drain electrode 405b, and an opening portion in a region overlapping with the first conductive layer 404. The first conductive layer 404 and the second conductive layer 407c are electrically connected to each other in the opening portion provided in the second insulating layer. Further, in the opening portions provided in the first insulating layer 406a and the second insulating layer 406b, the first source electrode 405a and the second source electrode 407a are electrically connected to each other and the first drain electrode 405b and the second drain electrode 407b are electrically connected to each other.

In the transistor 420 illustrated in FIGS. 3A to 3C, the oxide semiconductor layer 403 has a step in a region where an end portion of the gate electrode 401 is covered with the oxide semiconductor layer 403, and the step portion is locally thinner than the other region. A region where the first source electrode 405a and the first drain electrode 405b are in contact with the oxide semiconductor layer 403 is in a region where the oxide semiconductor layer 403 and the gate electrode 401 overlap with each other. That is, the first source electrode 405a and the first drain electrode 405b are formed over a flat surface of the oxide semiconductor layer 403 (a surface which is substantially parallel to an upper surface of the gate electrode 401). Accordingly, the first source electrode 405a and the first drain electrode 405b do not cover the step of the oxide semiconductor layer 403 and defective coverage with the first source electrode 405a and the first drain electrode 405b can be prevented.

Because the first source electrode 405a and the first drain electrode 405b are formed over the flat surface of the oxide semiconductor layer 403, the first source electrode 405a and the first drain electrode 405b are not in contact with a locally thin region where an electric field might concentrate in the oxide semiconductor layer 403, and thus, withstand voltage of the transistor 420 can be improved.

Further, in the transistor 420, the length of the oxide semiconductor layer 403 in a channel length (L) direction (a direction in which carriers flow) is longer than the length of the gate electrode 401 in a channel length direction. The oxide semiconductor layer 403 covers the gate electrode 401 with the gate insulating layer 402 interposed therebetween. Further, the second drain electrode 407b has a region overlapping with the gate electrode 401. In the region, the oxide semiconductor layer 403 is provided between the second drain electrode 407b and the gate electrode 401. That is, an end portion of the gate electrode 401 on the second drain electrode 407b side in a channel width (W) direction is covered with the oxide semiconductor layer 403 with the gate insulating layer 402 interposed therebetween.

Accordingly, in the transistor 420, the oxide semiconductor layer 403 is provided between the first drain electrode 405b and the gate electrode 401 and between the second drain electrode 407b and the gate electrode 401. When the oxide semiconductor layer 403 having high withstand voltage is provided between the gate electrode, and the first drain electrode and the second drain electrode both to which a high electric field is applied, generation of current between the gate electrode, and the first drain electrode or the second drain electrode can be prevented; accordingly, degradation or destruction of the transistor 420 can be suppressed.

In the transistor 420, the first conductive layer 404 and the second conductive layer 407c can serve as a second gate electrode (a so-called back gate electrode). It is preferable that the first conductive layer 404 be provided in a position which does not overlap with the first drain electrode 405b. The first conductive layer 404 is preferably formed between the first source electrode 405a and the first drain electrode 405b and over a flat surface of the first insulating layer 406a (a surface which is substantially parallel to an upper surface of the gate electrode 401).

When the first conductive layer 404 is formed over the flat surface of the first insulating layer 406a (a surface which is substantially parallel to an upper surface of the gate electrode 401), defective coverage with the first conductive layer 404 can be prevented. Further, the first conductive layer 404 is not in contact with locally thin regions in the first insulating layer 406a (regions covering end portions of the first source electrode 405a and the first drain electrode 405b, or the like); thus, withstand voltage of the transistor 420 can be improved. Moreover, the first drain electrode 405b does not overlap with the first conductive layer 404, whereby at least concentration of an electric field on the drain electrode side to which a high electric field is applied can be suppressed.

Further, the first conductive layer 404, the first source electrode 405a, and the first drain electrode 405b, or the first conductive layer 404, the second source electrode 407a, and the second drain electrode 407b are not positioned in the same layer, and the first insulating layer 406a and the second insulating layer 406b are provided, whereby generation of current between the first drain electrode or second drain electrode and the back gate electrode can be suppressed; thus, deterioration or destruction of the transistor 420 can be suppressed.

Figure 4A:
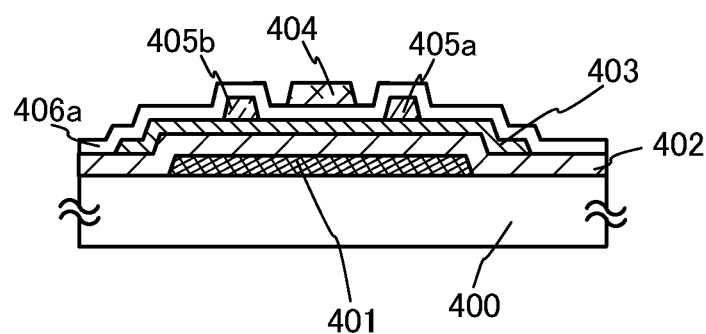
FIGS. 4A and 4B are cross-sectional views illustrating manufacturing steps of a semiconductor device.
Figure 4B:
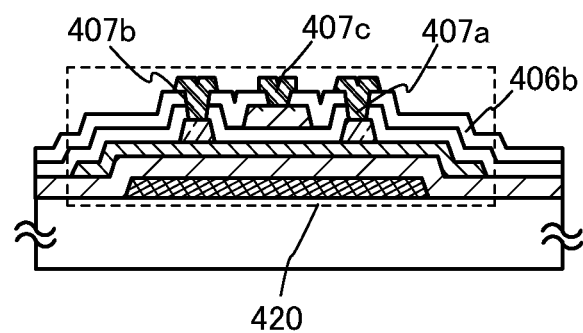

An example of a method for manufacturing the semiconductor device will be described below with reference to FIGS. 4A and 4B.

First, through the steps similar to those illustrated in FIGS. 2A to 2C, over the substrate 400 having an insulating surface, the gate electrode 401, the gate insulating layer 402 covering the gate electrode 401, the oxide semiconductor layer 403 provided over the gate insulating layer 402, and the first source electrode 405a and the first drain electrode 405b provided in contact with the oxide semiconductor layer 403 are formed. Then, the first insulating layer 406a covering the oxide semiconductor layer 403, the first source electrode 405a, the first drain electrode 405b, and the like is formed. Next, a conductive layer is formed over the first insulating layer 406a, and the conductive layer is selectively etched to form the first conductive layer 404 (see FIG. 4A). The first conductive layer 404 is preferably provided in a position which does not overlap with the first drain electrode 405b; the first conductive layer 404 is preferably formed between the first source electrode 405a and the first drain electrode 405b and over a flat surface of the first insulating layer 406a.

As in the insulating layer 406 illustrated in FIGS. 2A to 2D, the first insulating layer 406a can be formed using a material including an inorganic insulating material such as silicon oxide, silicon oxynitride, silicon nitride, hafnium oxide, aluminum oxide, or gallium oxide by a PVD method, a CVD method, or the like. Note that the first insulating layer 406a may have a single-layer structure or a stacked-layer structure of two or more layers.

After formation of the first insulating layer 406a, second heat treatment is preferably performed in an inert gas atmosphere or an oxygen atmosphere. The temperature of the heat treatment is set in the range of higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. The second heat treatment can reduce variation in electric characteristics of the transistor. In the case where the first insulating layer 406a contains oxygen, oxygen is supplied to the oxide semiconductor layer 403 to compensate oxygen deficiency of the oxide semiconductor layer 403, so that the oxide semiconductor layer can be an i-type (intrinsic) or substantially i-type oxide semiconductor layer. Note that the timing of the second heat treatment is not particularly limited thereto.

As described above, at least one of the first heat treatment and the second heat treatment is applied, whereby the oxide semiconductor layer 403 can be highly purified so as to contain impurities other than main components as little as possible.

With the use of the highly purified and intrinsic oxide semiconductor layer 403, off-state current of a transistor can be sufficiently reduced. Further, because an oxide semiconductor has an energy gap as wide as 3.0 eV to 3.5 eV and includes extremely few thermally excited carriers, characteristics of the transistor including an oxide semiconductor do not deteriorate even in a high temperature environment and high withstand voltage can be obtained.

The first conductive layer 404 can be formed in such a manner that a conductive layer is formed over the first insulating layer 406a and the conductive layer is selectively etched. The conductive layer to be the first conductive layer 404 can be formed by a PVD method such as a sputtering method or a CVD method such as a plasma CVD method. The details are similar to those of the first source electrode 405a and the first drain electrode 405b; thus, the description thereof can be referred to.

Next, the second insulating layer 406b covering the first conductive layer 404 and the like is formed. After that, an opening portion reaching the first conductive layer 404 is formed in the second insulating layer 406b, and an opening portion reaching the first source electrode 405a and an opening portion reaching the first drain electrode 405b are formed in the stack of the second insulating layer 406b and the first insulating layer 406a. Next, a conductive layer is formed over the second insulating layer 406b and the conductive layer is selectively etched to form the second source electrode 407a, the second drain electrode 407b, and the second conductive layer 407c (see FIG. 4B).

The second insulating layer 406b can be formed using a material and a deposition method similar to those of the first insulating layer 406a. The description of the first insulating layer 406a can be referred to for the details. Note that the second insulating layer 406b may have a single-layer structure or a stacked-layer structure including two or more layers.

The second source electrode 407a, the second drain electrode 407b, and the second conductive layer 407c can be formed in such a manner that a conductive layer is formed over the second insulating layer 406b and the conductive layer is selectively etched. The conductive layer to be the second source electrode 407a, the second drain electrode 407b, and the second conductive layer 407c can be formed by a PVD method such as a sputtering method or a CVD method such as a plasma CVD method. The details are similar to those of the first source electrode 405a and the first drain electrode 405b; thus, the description thereof can be referred to.

Thus, the transistor 420 is completed.

In the transistor 410 and the transistor 420 described in this embodiment, a first drain electrode to which a high electric field is applied in driving is formed over a flat surface, so that defective coverage with the first drain electrode is prevented. Thus, a thin region is not locally formed in the first drain electrode and destruction of a transistor due to concentration of an electric field in the thin region can be prevented.

Further, in the transistor 410 and the transistor 420 described in this embodiment, an end portion of a gate electrode on a drain electrode side in a channel width direction and an end portion of the gate electrode in a channel length direction are covered with an oxide semiconductor layer with a gate insulating layer interposed between the gate electrode and the oxide semiconductor layer. Because an oxide semiconductor has an energy gap as wide as 3.0 eV to 3.5 eV, withstand voltage is high and it is possible to suppress an undesired path of the electric field by providing the oxide semiconductor layer between the gate electrode and the drain electrode. Further, the oxide semiconductor has extremely few thermally excited carriers, so that a transistor including an oxide semiconductor can have high reliability without degradation of characteristics even in a high temperature environment. With the use of the highly purified and intrinsic oxide semiconductor layer 403, off-state current of the transistor can be sufficiently reduced.

Note that this embodiment can be freely combined with any of the other embodiments.

(Embodiment 2)

In this embodiment, a structure of a semiconductor device different from that described in Embodiment 1 will be described with reference to FIGS. 5A and 5B, FIGS. 6A and 6B, and FIGS. 7A and 7B. Note that detailed description of the portion same as or a portion having a function similar to that in Embodiment 1 is omitted.

Figures 5A, 5B:
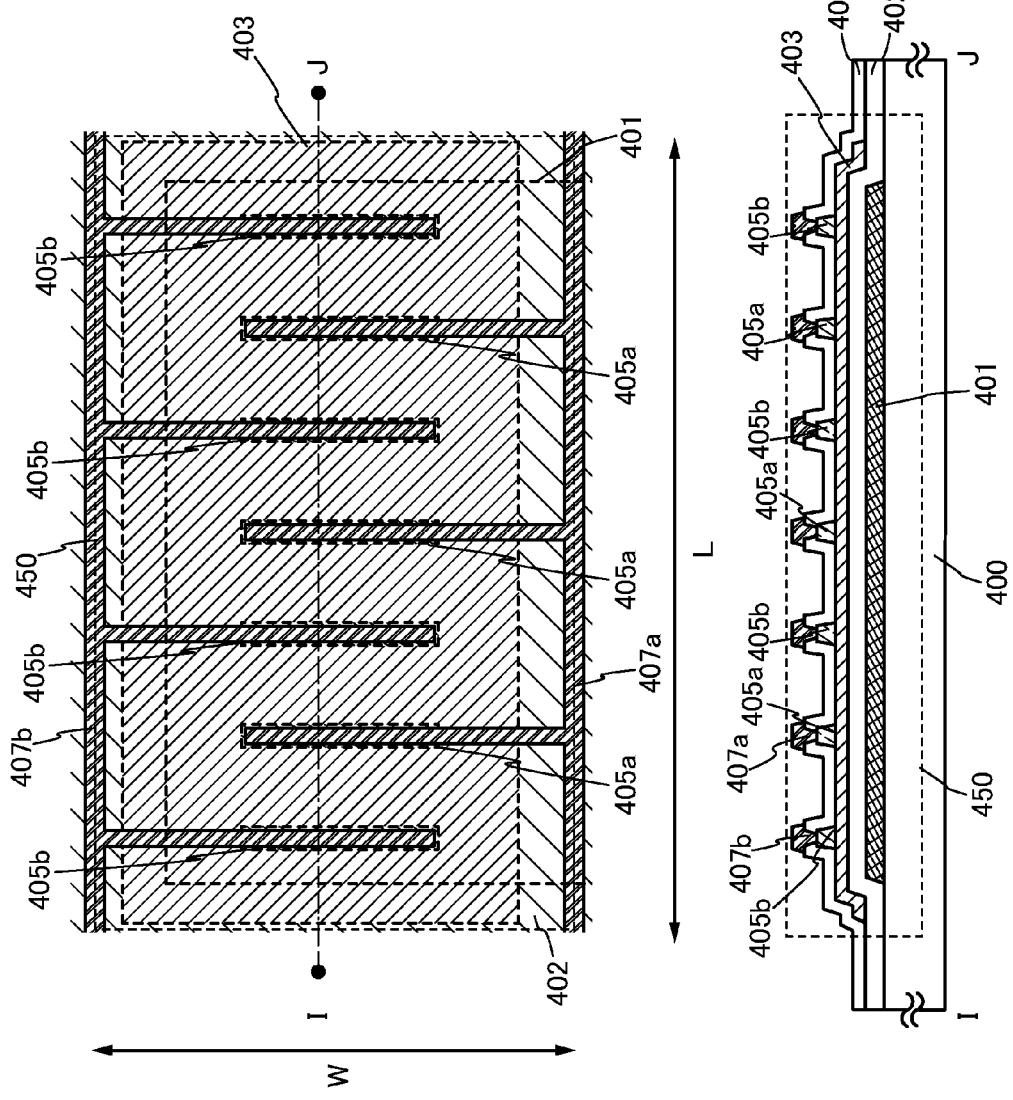
FIGS. 5A and 5B are a plan view and a cross-sectional view of a semiconductor device.

FIG. 5A is a plan view of a transistor 450 and FIG. 5B is a cross-sectional view taken along line I-J in FIG. 5A.

The transistor 450 illustrated in FIGS. 5A and 5B includes, over the substrate 400, the gate electrode 401, the gate insulating layer 402 covering the gate electrode 401, the oxide semiconductor layer 403 provided over the gate insulating layer 402, a plurality of first source electrodes 405a (three first source electrodes 405a in FIGS. 5A and 5B) and a plurality of first drain electrodes 405b (four first drain electrodes 405b in FIGS. 5A and 5B) provided in contact with the oxide semiconductor layer 403, the insulating layer 406 covering the oxide semiconductor layer 403, the plurality of first source electrodes 405a, and the plurality of first drain electrodes 405b, and the second source electrode 407a and the second drain electrode 407b provided over the insulating layer 406. In the insulating layer 406, opening portions (contact holes) are provided each in a region overlapping with one of the plurality of first source electrodes 405a and the plurality of first drain electrodes 405b. In the opening portions, the second source electrode 407a is electrically connected to each of the first source electrodes 405a and the second drain electrode 407b is electrically connected to each of the first drain electrodes 405b.

As illustrated in FIGS. 5A and 5B, when the first electrode 405a and the first drain electrode 405b are provided more than one, an effective channel width of the transistor 450 can be increased. Note that the same potential is applied to each of the first source electrodes 405a through the second source electrode 407a, and the same potential is applied to each of the first drain electrodes 405b through the second drain electrode 407b.

In the transistor 450 illustrated in FIGS. 5A and 5B, a region where each of the first source electrodes 405a and the first drain electrodes 405b is in contact with the oxide semiconductor layer 403 is in a region where the oxide semiconductor layer 403 and the gate electrode 401 overlap with each other. That is, each of the first source electrodes 405a and the first drain electrodes 405b is formed over a flat surface of the oxide semiconductor layer 403 (a surface which is substantially parallel to an upper surface of the gate electrode 401). Accordingly, since the first source electrodes 405a and the first drain electrodes 405b do not cover the step of the oxide semiconductor layer 403, defective coverage with the first source electrodes 405a and the first drain electrodes 405b can be prevented. Further, because the first source electrodes 405a and the first drain electrodes 405b are not in contact with a locally thin region where an electric field might concentrate in the oxide semiconductor layer 403, withstand voltage of the transistor 450 can be improved.

Further, in the transistor 450, the length of the oxide semiconductor layer 403 in a channel length (L) direction (a direction in which carriers flow) is longer than the length of the gate electrode 401 in a channel length direction. The oxide semiconductor layer 403 covers the gate electrode 401 with the gate insulating layer 402 interposed therebetween in a channel length direction. Further, the second drain electrode 407b has a region overlapping with the gate electrode 401. In the region, the oxide semiconductor layer 403 is provided between the second drain electrode 407b and the gate electrode 401. That is, an end portion of the gate electrode 401 on the second drain electrode 407b side in a channel width (W) direction is covered with the oxide semiconductor layer 403 with the gate insulating layer 402 interposed therebetween.

Accordingly, in the transistor 450, the oxide semiconductor layer 403 is provided between the first drain electrode 405b and the gate electrode 401 and between the second drain electrode 407b and the gate electrode 401. An oxide semiconductor has an energy gap as wide as 3.0 eV to 3.5 eV and thus, withstand voltage is high. When the oxide semiconductor layer 403 having high withstand voltage is provided between the gate electrode, and the first drain electrode and the second drain electrode both to which a high electric field is applied, generation of current between the gate electrode, and the first drain electrode or the second drain electrode can be prevented; accordingly, degradation or destruction of the transistor 450 can be suppressed.

Note that the method for manufacturing the transistor 410 can be referred to for a method for manufacturing the transistor 450.

Modification Example 1

Next, another structure of the semiconductor device illustrated in FIGS. 5A and 5B will be described with reference to FIGS. 6A and 6B.

Figures 6A, 6B:
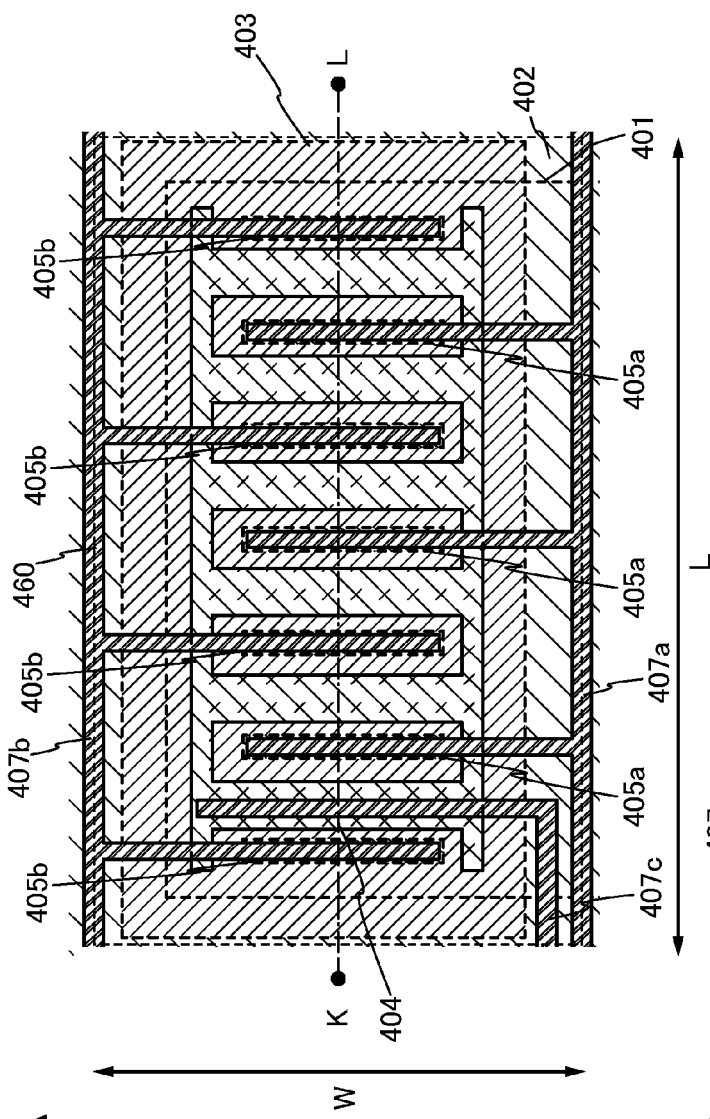
FIGS. 6A and 6B are a plan view and a cross-sectional view of a semiconductor device.

FIG. 6A is a plan view of a transistor 460 and FIG. 6B is a cross-sectional view taken along line K-L in FIG. 6A.

The transistor 460 illustrated in FIGS. 6A and 6B includes, over the substrate 400, the gate electrode 401, the gate insulating layer 402 covering the gate electrode 401, the oxide semiconductor layer 403 provided over the gate insulating layer 402, the plurality of first source electrodes 405a and the plurality of first drain electrodes 405b provided in contact with the oxide semiconductor layer 403, the first insulating layer 406a covering the oxide semiconductor layer 403, the plurality of first source electrodes 405a, and the plurality of first drain electrodes 405b, the first conductive layer 404 provided over the first insulating layer 406a, the second insulating layer 406b covering the first conductive layer 404, and the second source electrode 407a, the second drain electrode 407b, and the second conductive layer 407c provided over the second insulating layer 406b. The first insulating layer 406a has opening portions (contact holes) each in a region overlapping with one of the first source electrodes 405a and the first drain electrodes 405b. The second insulating layer 406b has opening portions each in a region overlapping with one of the first source electrodes 405a, the first drain electrodes 405b, and the first conductive layer 404. The first conductive layer 404 and the second conductive layer 407c are electrically connected to each other in the opening portion provided in the second insulating layer 406b. Further, in the openings provided in the first insulating layer 406a and the second insulating layer 406b, each of the first source electrodes 405a is electrically connected to the second source electrode 407a and each of the first drain electrodes 405b is electrically connected to the second drain electrode 407b.

As illustrated in FIGS. 6A and 6B, when the first electrode 405a and the first drain electrode 405b are provided more than one, an effective channel width of the transistor 460 can be increased; thus, concentration of an electric field can be alleviated. Note that the same potential is applied to each of the first source electrodes 405a through the second source electrode 407a, and the same potential is applied to each of the first drain electrodes 405b through the second drain electrode 407b.

In the transistor 460 illustrated in FIGS. 6A and 6B, a region where each of the first source electrodes 405a and the first drain electrodes 405b is in contact with the oxide semiconductor layer 403 is in a region where the oxide semiconductor layer 403 and the gate electrode 401 overlap with each other. That is, each of the first source electrodes 405a and the first drain electrodes 405b is formed over a flat surface of the oxide semiconductor layer 403 (a surface which is substantially parallel to an upper surface of the gate electrode 401). Accordingly, since the first source electrodes 405a and the first drain electrodes 405b do not cover the step of the oxide semiconductor layer 403, defective coverage with the first source electrodes 405a and the first drain electrodes 405b can be prevented. Further, because each of the first source electrodes 405a and the first drain electrodes 405b is formed over the flat surface of the oxide semiconductor layer 403, the first source electrodes 405a and the first drain electrodes 405b are not in contact with a locally thin region where an electric field might concentrate in the oxide semiconductor layer 403, and withstand voltage of the transistor 460 can be improved.

Further, in the transistor 460, the length of the oxide semiconductor layer 403 in a channel length (L) direction (a direction in which carriers flow) is longer than the length of the gate electrode 401 in a channel length direction. The oxide semiconductor layer 403 covers the gate electrode 401 with the gate insulating layer 402 interposed therebetween. Further, the second drain electrode 407b has a region overlapping with the gate electrode 401. In the region, the oxide semiconductor layer 403 is provided between the second drain electrode 407b and the gate electrode 401. That is, an end portion of the gate electrode 401 on the second drain electrode 407b side in a channel width (W) direction is covered with the oxide semiconductor layer 403 with the gate insulating layer 402 interposed therebetween.

Accordingly, in the transistor 460, the oxide semiconductor layer 403 is provided between each of the first drain electrodes 405b and the gate electrode 401 and between the second drain electrode 407b and the gate electrode 401. When the oxide semiconductor layer 403 having high withstand voltage is provided between the gate electrode, and the first drain electrode and the second drain electrode both to which a high electric field is applied, generation of current between the gate electrode, and the first drain electrode or the second drain electrode can be prevented; accordingly, degradation or destruction of the transistor 460 can be suppressed.

In the transistor 460, the first conductive layer 404 and the second conductive layer 407c can function as a second gate electrode (a so-called back gate electrode). The first conductive layer 404 is preferably formed over a flat surface of the first insulating layer 406a (a surface which is substantially parallel to an upper surface of the gate electrode 401). When the first conductive layer 404 is formed over the flat surface of the first insulating layer 406a, defective coverage with the first conductive layer 404 can be prevented. Further, the first conductive layer 404 is not in contact with a locally thin region in the first insulating layer 406a; thus, withstand voltage of the transistor 460 can be improved. Furthermore, in order to suppress leakage current, the first conductive layer 404 is preferably provided so as to surround each of the first source electrodes 405a and the first drain electrodes 405b.

In the transistor 460, the first insulating layer 406a and the second insulating layer 406b are provided so that the first conductive layer 404, and the first source electrode 405a and the first drain electrode 405b are not positioned in the same layer, and that the first conductive layer 404, and the second source electrode 407a and the second drain electrode 407b are not positioned in the same layer. Thus, it is possible to suppress an undesired path of the electric field from the first drain electrode or the second drain electrode to the back gate electrode, and deterioration or destruction of the transistor 460 can be suppressed.

Note that the method for manufacturing the transistor 420 can be referred to for a method for manufacturing the transistor 460.

Modification Example 2

Next, another structure of the semiconductor device illustrated in FIGS. 5A and 5B will be described with reference to FIGS. 7A and 7B.

FIG. 7A is a plan view of a transistor 470 and FIG. 7B is a cross-sectional view taken along line M-N in FIG. 7A.

A transistor 470 illustrated in FIGS. 7A and 7B has the same structure as the transistor 460 illustrated in FIGS. 6A and 6B. That is, the transistor 470 includes, over the substrate 400, the gate electrode 401, the gate insulating layer 402 covering the gate electrode 401, the oxide semiconductor layer 403 provided over the gate insulating layer 402, the plurality of first source electrodes 405a and the plurality of first drain electrodes 405b provided in contact with the oxide semiconductor layer 403, the first insulating layer 406a covering the oxide semiconductor layer 403, the plurality of first source electrodes 405a, and the plurality of first drain electrodes 405b, the first conductive layer 404 provided over the first insulating layer 406a, the second insulating layer 406b covering the first conductive layer 404, and the second source electrode 407a, the second drain electrode 407b, and the second conductive layer 407c provided over the second insulating layer 406b.

The difference between the transistor 470 illustrated in FIGS. 7A and 7B and the transistor 460 illustrated in FIGS. 6A and 6B is a position of the first conductive layer 404. In the transistor 460, the first conductive layer 404 is provided so as to surround each of the first source electrodes 405a and the first drain electrodes 405*b*, while in the transistor 470, the first conductive layer 404 is provided so as to surround each of the first source electrodes 405*a* and so as not to overlap with the second drain electrode 407*b*. When the first conductive layer 404 is provided as illustrated in FIGS. 7A and 7B, leakage current can be suppressed and concentration of an electric field in an interlayer film (here, the first insulating layer 406*a* and the second insulating layer 406*b*) between a drain electrode and a back gate electrode can be prevented; thus, degradation of the transistor 470, or destruction of the transistor 470 can be prevented.

Note that the essence of the disclosed invention is that a first source electrode and a first drain electrode are formed over a flat surface and an end portion of a gate electrode on a drain electrode side in a channel width direction and an end portion of the gate electrode in a channel length direction are covered with an oxide semiconductor layer with a gate insulating layer interposed therebetween so that withstand voltage of a transistor is improved; therefore, the number, positions, and the like of each electrode are not limited to those described in Embodiment 1 or 2.

In the transistors 450 to 470 described in this embodiment, a first drain electrode to which a high electric field is applied in driving is formed over a flat surface of an oxide semiconductor layer, so that defective coverage with the first drain electrode is prevented. Further, since the first drain electrode is not in contact with a locally thin region in the oxide semiconductor layer 403, destruction of a transistor due to concentration of an electric field in the thin region can be prevented.

Further, in the transistors 450 to 470 described in this embodiment, an end portion of a gate electrode on a drain electrode side in a channel width direction and an end portion of the gate electrode in a channel length direction are covered with an oxide semiconductor layer with a gate insulating layer interposed between the gate electrode and the oxide semiconductor layer. Because an oxide semiconductor has an energy gap as wide as 3.0 eV to 3.5 eV, withstand voltage is high and it is possible to suppress an undesired path of the electric field by providing the oxide semiconductor layer between the gate electrode and the drain electrode. Further, the oxide semiconductor has extremely few thermally excited carriers, so that a transistor including an oxide semiconductor can have high reliability without degradation of characteristics even in a high temperature environment. With the use of the highly purified and intrinsic oxide semiconductor layer 403, off-state current of the transistor can be sufficiently reduced.

This embodiment can be freely combined with any of the other embodiments.

(Embodiment 3)

A variety of semiconductor devices can be manufactured using the transistors described in any of the above embodiments. For example, a circuit which converts DC voltage at a given value into DC voltage at another value (also referred to as a DC converter circuit or a DC-DC converter) can be used in the case where power supply voltage at a stable value is generated from voltage with large fluctuation or in the case where power supply voltage at a plurality of different values is needed. The transistors described in the above embodiments are transistors with improved withstand voltage; therefore, a highly reliable DC converter circuit can be formed using the transistors.

Further, the DC converter circuit in which the transistors are used can form a power supply circuit by combining with a variety of power storage devices. In this embodiment, a power supply circuit including any of the transistors described in the above embodiments will be described.

Figure 8:
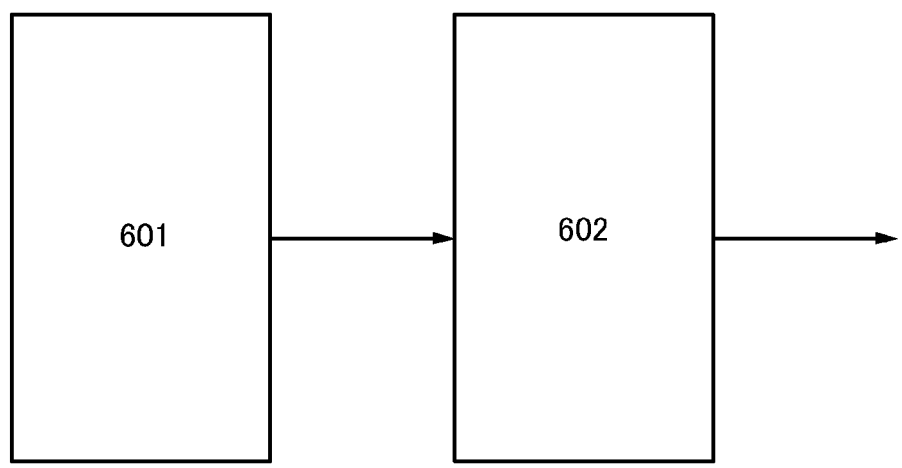
FIG. 8 is a view illustrating a power supply circuit.

An example of a configuration of the power supply circuit in this embodiment will be described with reference to FIG. 8. FIG. 8 is a block diagram illustrating an example of the configuration of the power supply circuit in this embodiment.

The power supply circuit illustrated in FIG. 8 includes a power storage device 601 and a DC converter circuit 602.

The power storage device 601 has a function of supplying electric power. As the power storage device 601, for example, one or more of a photoelectric conversion device, a lithium ion secondary battery, a lithium ion capacitor, an electric double-layer capacitor, and a redox capacitor can be used. For example, the combination of a lithium ion secondary battery and a lithium ion capacitor can be a power storage device capable of high-speed charging and discharging and of supplying electric power for a long time. The power storage device 601 is not limited to the lithium ion secondary battery. For the power storage device 601, a secondary battery in which another alkali metal ion, alkaline earth metal ion, or the like is used as a mobile ion may be used. In addition, the power storage device 601 is not limited to the lithium ion capacitor. For the power storage device 601, a capacitor in which another alkali metal ion, alkaline earth metal ion, or the like is used as a mobile ion may be used.

The DC converter circuit 602 is electrically connected to the power storage device 601. Any of the transistors described in Embodiments 1 and 2 can be used in the DC converter circuit 602, for example.

As illustrated in FIG. 8, an example of the power supply circuit of this embodiment includes a power storage device and a DC converter circuit. Electric power supplied by the power storage device is raised or lowered by the DC converter circuit, whereby power supply voltage which is suitable for the specification of the device to which electric power is supplied is generated. Further, any of the transistors described in the above embodiments is used as part of the DC converter circuit in the power supply circuit of this embodiment, so that reliability of the power supply circuit can be increased.

This embodiment can be combined with or replaced by any of other embodiments as appropriate.

(Embodiment 4)

In this embodiment, examples of an electronic device to which the power supply circuit according to Embodiment 3 can be applied will be described with reference to FIGS. 9A and 9B.

Figure 9A:
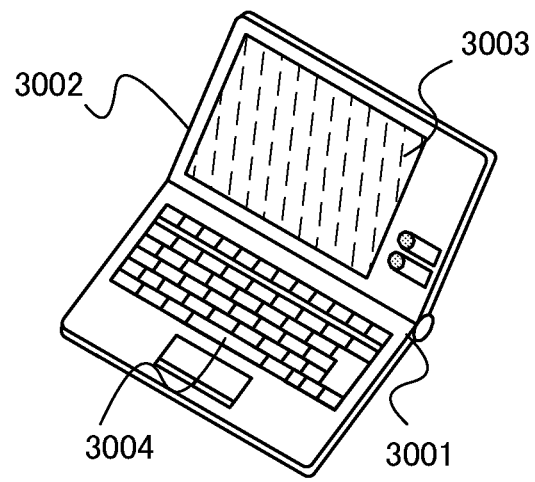
FIGS. 9A and 9B are views each illustrating an electronic appliance.

FIG. 9A is a notebook personal computer, which includes a main body 3001, a housing 3002, a display portion 3003, a keyboard 3004, and the like. The power supply circuit described in Embodiment 3 can be used to generate power supply voltage which is supplied to the notebook personal computer illustrated in FIG. 9A.

Figure 9B:
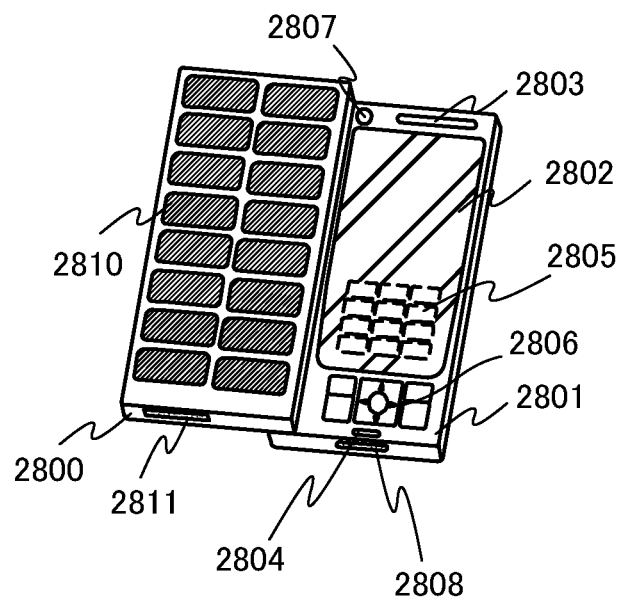

FIG. 9B is a portable information terminal, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2801 is provided with a solar cell 2810 for charging of the portable information terminal, an external memory slot 2811, and the like. Further, an antenna is incorporated in the housing 2801.

Further, the display panel 2802 is provided with a touch panel. A plurality of operation keys 2805 that is displayed as images is illustrated by dashed lines in FIG. 9B. The portable information terminal illustrated in FIG. 9B includes a power supply circuit including the solar cell 2810 and a DC converter circuit which converts voltage which is output from the solar cell 2810 into voltage which is necessary for each circuit. The power supply circuit in Embodiment 3 can be applied to the power supply circuit in this embodiment.

Thus, the power supply circuit in Embodiment 3 can be used in a variety of electronic devices; accordingly, a highly reliable electronic device can be provided.

This embodiment can be combined with or replaced by any of other embodiments as appropriate.

This application is based on Japanese Patent Application serial no. 2010-116568 filed with Japan Patent Office on May 20, 2010, the entire contents of which are hereby incorporated by reference.

What is claimed is:

1. A semiconductor device comprising:
a gate electrode;
a gate insulating layer over the gate electrode;
an oxide semiconductor layer over the gate insulating layer;
an insulating layer over the oxide semiconductor layer, the insulating layer comprising a first contact hole and a second contact hole;
a first electrode over the insulating layer, the first electrode comprising a first layer and a second layer; and
a second electrode over the insulating layer, the second electrode comprising a third layer and a fourth layer,
wherein the first layer is in direct contact with the oxide semiconductor layer and has a tapered shape,
wherein the second layer is over the insulating layer and in direct contact with the first layer through the first contact hole,
wherein the third layer is in direct contact with the oxide semiconductor layer and has a tapered shape,
wherein the fourth layer is over the insulating layer and in direct contact with the third layer through the second contact hole,
wherein the oxide semiconductor layer overlaps with the first layer and the second layer, and
wherein the oxide semiconductor layer overlaps with the third layer and the fourth layer.

2. A semiconductor device comprising:
a gate electrode;
a gate insulating layer over the gate electrode;
an oxide semiconductor layer over the gate insulating layer;
a first insulating layer over the oxide semiconductor layer, the first insulating layer comprising a first contact hole and a second contact hole;
a second insulating layer over the first insulating layer, the second insulating layer comprising a third contact hole and a fourth contact hole;
a first electrode comprising a first layer and a second layer;
a second electrode comprising a third layer and a fourth layer; and
a conductive layer between the first electrode and the second electrode,
wherein the first layer is in direct contact with the oxide semiconductor layer and has a tapered shape,
wherein the second layer is over the insulating layer and in direct contact with the first layer through the first contact hole and the third contact hole,
wherein the third layer is in direct contact with the oxide semiconductor layer and has a tapered shape,
wherein the fourth layer is over the insulating layer and in direct contact with the third layer through the second contact hole and the fourth contact hole,
wherein the oxide semiconductor layer overlaps with the first layer and the second layer, and
wherein the oxide semiconductor layer overlaps with the third layer and the fourth layer.

3. A semiconductor device comprising:
a gate electrode;
a gate insulating layer over the gate electrode;
an oxide semiconductor layer over the gate insulating layer;
an insulating layer over the oxide semiconductor layer, the insulating layer comprising a first contact hole, a second contact hole, a third contact hole, and a fourth contact hole;
a first electrode over the insulating layer, the first electrode being electrically connected to a first source electrode and a second source electrode; and
a second electrode over the insulating layer, the second electrode being electrically connected to a first drain electrode and a second drain electrode,
wherein the first source electrode is in direct contact with the oxide semiconductor layer through the first contact hole,
wherein the first drain electrode is between the first source electrode and the second source electrode and in direct contact with the oxide semiconductor layer through the second contact hole,
wherein the second source electrode is between the first drain electrode and the second drain electrode and in direct contact with the oxide semiconductor layer through the third contact hole, and
wherein the second drain electrode is in direct contact with the oxide semiconductor layer through the fourth contact hole.

4. A semiconductor device comprising:
a gate electrode;
a gate insulating layer over the gate electrode;
an oxide semiconductor layer over the gate insulating layer;
a first insulating layer over the oxide semiconductor layer, the first insulating layer comprising a first contact hole, a second contact hole, a third contact hole, and a fourth contact hole;
a second insulating layer over the first insulating layer, the second insulating layer comprising a fifth contact hole, a sixth contact hole, a seventh contact hole, and an eighth contact hole;
a first electrode over the second insulating layer, the first electrode being electrically connected to a first source electrode and a second source electrode; and
a second electrode over the second insulating layer, the second electrode being electrically connected to a first drain electrode and a second drain electrode,
wherein the first source electrode is in direct contact with the oxide semiconductor layer through the first contact hole and the fifth contact hole,
wherein the first drain electrode is between the first source electrode and the second source electrode and in direct contact with the oxide semiconductor layer through the second contact hole and the sixth contact hole,
wherein the second source electrode is between the first drain electrode and the second drain electrode and in direct contact with the oxide semiconductor layer through the third contact hole and the seventh contact hole, and
wherein the second drain electrode is in direct contact with the oxide semiconductor layer through the fourth contact hole and the eighth contact hole.

5. The semiconductor device according to claim 1, wherein the oxide semiconductor layer comprises indium.

6. The semiconductor device according to claim 2, wherein the oxide semiconductor layer comprises indium.

7. The semiconductor device according to claim 3, wherein the oxide semiconductor layer comprises indium.

8. The semiconductor device according to claim 4, wherein the oxide semiconductor layer comprises indium.

9. The semiconductor device according to claim 1, wherein the semiconductor device is a power MOSFET.

10. The semiconductor device according to claim 2, wherein the semiconductor device is a power MOSFET.

11. The semiconductor device according to claim 3, wherein the semiconductor device is a power MOSFET.

12. The semiconductor device according to claim 4, wherein the semiconductor device is a power MOSFET.

13. The semiconductor device according to claim 4, further comprising a conductive layer between the first source electrode and the first drain electrode.

14. The semiconductor device according to claim 3,
wherein the first electrode and the second electrode respectively comprise a stacked structure.

15. The semiconductor device according to claim 4,
wherein the first electrode and the second electrode respectively comprise a stacked structure.

16. The semiconductor device according to claim 1,
wherein the first electrode is opposite the second electrode in a channel width direction.

17. The semiconductor device according to claim 2,
wherein the first electrode is opposite the second electrode in a channel width direction.

* * * * *